United States Patent [19]

Lowe

[11] Patent Number: 5,459,941
[45] Date of Patent: Oct. 24, 1995

[54] REGISTRATION SYSTEM

[76] Inventor: John M. Lowe, 7 The Heights, Market Harborough, Leicestershire LE16 8BQ, England

[21] Appl. No.: 117,012

[22] PCT Filed: Mar. 6, 1992

[86] PCT No.: PCT/GB92/00406

§ 371 Date: Oct. 28, 1993

§ 102(e) Date: Oct. 28, 1993

[87] PCT Pub. No.: WO92/16090

PCT Pub. Date: Sep. 17, 1992

[30] Foreign Application Priority Data

Mar. 6, 1991 [GB] United Kingdom ............. 9104705

[51] Int. Cl.[6] .......................................... B41B 11/00
[52] U.S. Cl. ................. 33/620; 33/614; 101/481; 101/DIG. 36
[58] Field of Search .................... 33/1 B, 1 L, 614, 33/615, 616, 617, 619, 620, 621, 645; 101/481, 485, DIG. 36; 364/468

[56] References Cited

U.S. PATENT DOCUMENTS

| | | | |
|---|---|---|---|
| 4,005,651 | 2/1977 | Sigel et al. | 101/DIG. 36 |
| 4,516,495 | 5/1985 | Ericsson | 33/614 |
| 4,610,200 | 9/1986 | Metso | 101/126 |
| 4,827,626 | 5/1989 | Wieland | 33/620 |
| 4,934,064 | 6/1990 | Yamaguchi et al. | 33/645 |
| 5,031,334 | 7/1991 | Takamura | 33/621 |
| 5,117,365 | 5/1992 | Jeschke et al. | 101/481 |
| 5,136,948 | 8/1992 | Fujino et al. | 33/621 |
| 5,168,805 | 12/1992 | Kasanami et al. | 101/DIG. 36 |

FOREIGN PATENT DOCUMENTS

| | | | |
|---|---|---|---|
| 0036206 | 9/1981 | European Pat. Off. | 101/DIG. 36 |
| 0137569 | 4/1985 | European Pat. Off. | |
| 0279147 | 8/1988 | European Pat. Off. | |
| 3091250 | 4/1988 | Japan | 101/DIG. 36 |
| 63-207646 | 8/1988 | Japan | |
| 1-297888 | 11/1989 | Japan | |
| 2-123789 | 5/1990 | Japan | |
| 2031341 | 4/1980 | United Kingdom | 101/DIG. 36 |
| 2088283 | 6/1982 | United Kingdom | |

*Primary Examiner*—Thomas B. Will
*Attorney, Agent, or Firm*—Austin R. Miller

[57] ABSTRACT

A method and apparatus for use in printing which includes a print table mounted on a base frame, a support secured to the print table, a vision device secured to the support which is disposed such that the vision device uses a major face of the print table, securing a substrate to the print table, mounting a screen, a device for effecting relative movement between the print table and screen mounting from a first position in which the vision device can view fiducial marks carried by the substrate to a second position in which the screen is positioned between the vision device and the substrate, in which the vision device can view fiducial marks carried by the screen to facilitate the adjustment of relative positions of the screen and substrate so that the fiducial marks on the screen and substrate are in register.

10 Claims, 1 Drawing Sheet

REGISTRATION SYSTEM

This invention relates to apparatus for and methods of accurate alignment of a screen and a subject substrate using a vision system especially for use in screen printing in the manufacture of printed circuits.

Early methods of screen printing, some of which are still being used, entailed the manual alignment of the screen over the subject substrate such that the registration markers, often called fiducials, on the screen and the subject substrate coincided, when viewed through the screen. As there was a high degree of subjective choice involved in this method, it was essentially a trial-and-error system and usually required several attempts to achieve the desired result.

The repeatability obtained from this method was dependant on the similarity of the substrates, the accuracy of placing each subject substrate on the print table and the capability of the printing machine to maintain the screen in the original set position.

The use of screen printing techniques for multi-colour graphics and for the deposition of etch resist and solder resist media in the printed circuit industry led to ever increasing demands for better registration techniques.

In response to these demands for closer tolerance registration, systems were introduced, comprising one or more CCD cameras having a suitable lens arrangement, which fed into a system, typically microprocessor based, which provided magnified images of the registration marks on a cathode-ray tube display device. Such devices, typically, further comprised electronically generated graticules, which allowed fine adjustment of the screen and substrate by means of micrometer adjustments. These adjustments were usually made manually but some semi-automatic or automatic systems have been tried. Patent Specification EP 204901 discloses a semi-automatic screen printing machine using stepping motors.

In these prior art arrangements the cameras are mounted directly or indirectly, via additional sub-frames, to the main frame of the machine. This gives rise to several sources of positional error, namely the mounting of the screen to the main machine frame; the repeatability of the print table "in" position, the repeatability of the print table "out" position; the repeatability of the substrate's position on the print table and the rigidity of the camera mounts.

In order to achieve the improved absolute registration required, the line of development in this field has concentrated on improving the mechanical integrity of the machine. This is especially aimed at reducing displacement errors in the moving parts. On pursuing this line of development, it has been found that if the three most significant parameters are controlled to a tolerance of 0.0025 cm which in the case of the print table movement, typically represents an accuracy of 0.003%, then the overall maximum accuracy of the registration of such a system will be 0.0075 cm. This is not sufficient for the degree of accuracy preferable for some applications.

Accordingly, in one aspect the present invention may provide apparatus for use in printing, comprising a print table mounted on a base frame of the apparatus, support means adapted to rapidly mount vision means on the table, disposed such that the vision means views a major face of the print table, means for securing a substrate to the print table, printing means, and means for effecting relative movement between the print table and printing means whereby to move the printing means and a substrate mounted on the print table into register, the vision means being positioned to view fiducial marks carried by the substrate and to view fiducial marks carried by the printing means whereby to facilitate the adjustment of the relative positions of the printing means and the substrate so that the fiducial marks on the printing means and the substrate are in register, thereby effecting registration of printing means and substrate. Preferably the printing means comprises means for mounting a screen for use in a screen printing process, and fiducial marks are carried by the screen.

Said vision means may comprise a pair of CCD cameras, each with an appropriate lens system.

In one embodiment of the invention the support means comprises a rigid support frame having two rectilinear members rigidly joined at right angles to each other, forming an L-shaped rigid frame portion, and further comprising a support assembly disposed at the end opposite the junction of the said planar members, adapted to adjustably fix the vision means.

In an embodiment of the invention, the arrangement further comprises an image processing unit, adapted to process image data from the vision means and output processed image data to a display means. Said display means may comprise a cathode ray tube display device. Said image processing unit is preferably a micro-processor based system. In a still further embodiment the arrangement produces an image on the display device, which is an image, as viewed by the vision means but has an additional variable position graticule superimposed thereon. Said graticule may comprise a pair of cross-hairs. In a further preferred embodiment a human operator controls the position of the variable position graticule.

Apparatus embodying the invention will now be described with reference to the following drawings in which.

Figure 1:
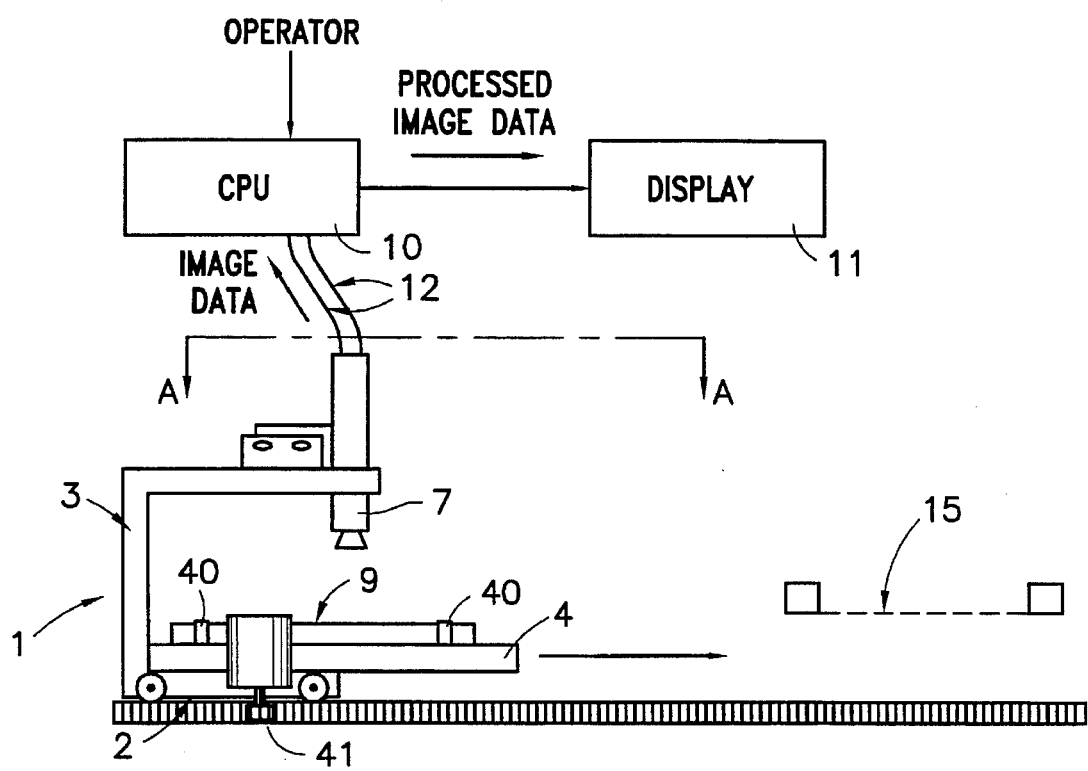
FIG. 1 represents a front view of the whole apparatus.
Figure 2:
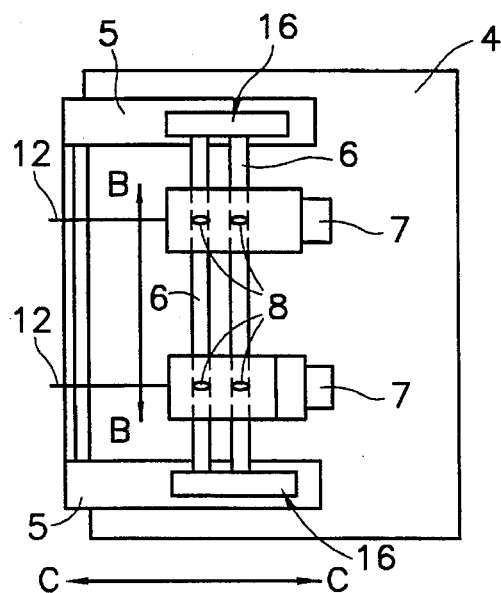
FIG. 2 represents a plan view of FIG. 1.

A rigid support frame, generally denoted 1, comprises two rectilinear members arranged perpendicularly to one another forming an L-shaped rigid frame portion as shown in FIG. 1, namely a base member 2 and an upright member 3. The base member 2 is rigidly connected to a conventional print table 4. The print table 4 is adapted to mount and fixedly retain a subject substrate 9 in a manner which is familiar to the art e.g. by nest plates (not shown) or pins 40. The upright member 3 is further rigidly attached, at the end opposite the junction between the members 2 and 3, to a support assembly which comprises a first pair of parallel support members 5, projecting from opposite lateral extremities of the member 3 in an orientation parallel to and above the base member 2 as shown in FIG. 2. The support assembly further comprises a second pair of spaced parallel support members 6, orientated in a direction transverse to the first pair of support members 5, and provides a connecting support therebetween. The support members 6 are attached to the members 5 by a bracket arrangement 16 which permits adjustment in the direction defined by the line C—C.

The print table 4 itself is mounted on a base frame of the apparatus for movement between a loading and unloading position and an operative print position.

The pair of support members 6 support a pair of CCD cameras and their associated systems, generally denoted 7, whose field of view is generally towards the print table 4. The cameras 7 are fitted with lenses which give sufficient magnification for the increment resolution of the system to be smaller than any adjustment required. Each camera 7 is firmly mounted on the support members 6, using brackets 8, which allows the manual, mechanical adjustment of the positions of the cameras 7 along an axis defined by the line B—B. This, in combination with brackets 16, allows the field of view of the cameras 7 to be adjusted appropriately according to the general position of a subject substrate 9 mounted on the table 4. Both bracket arrangements 8 and 16 may comprise any arrangement which will firmly and stably secure the cameras 7, yet will permit easy adjustment when required.

In this preferred embodiment the camera and lens combinations 7 are connected to an image processing unit 10, which is typically microprocessor based, via communication channels 12, the unit 10 in turn being connected to a display device 11, via communication channel 12. The display device 11 may typically comprise a cathode ray display tube. The image processing unit 10 receives the image data, via channel 12, and appropriately processes it so that when the processed image data is used to drive the display 11, via communication channel 12, graticules are superimposed on the original image as viewed by the camera 7. The absolute position of the graticules on the display 11 is controllable by the operator, through the image processing unit 10. Preferably the operator will be able to make use of a joystick to control the position of the graticule. It will be appreciated that as the graticules can be software generated, it will be possible to easily configure the graticule geometry to suit the particular application.

The screen 15 in FIG. 1 is of a type well known in the area of screen printing.

In use a subject substrate 9 is fixedly retained on the print table 4. The cameras 7 are then mechanically aligned, using the bracketing arrangements 8 and 16, to view the subject substrate 9 approximately over the area containing the registration markers, hereinafter called the "fiducials" of the subject substrate. The operator then uses the image processing unit 10 to electronically bring into register the graticules with the centre of the subject substrate fiducials. This electronic registration obviates the mechanical complexity inherent in the prior art clamping arrangements. The whole assembly 1 is then moved to the printing position into co-operation with the screen 15, so that the screen is positioned between the substrate 9 and cameras 7, permitting the cameras 7 to view the screen 15. The fiducials of the screen 15 are then brought by adjustment of the screen position into register with the graticules, which are still directed at the fiducials of the subject substrate 9, thus bringing into register the screen 15 with the subject substrate 9. The X–Y positions of the substrate fiducials are then stored, as the positions of the graticules of the opto-electronic system.

A test print is then made using a squeegee, in a screen printing process familiar to the art, and the whole assembly is withdrawn so that the overprinted subject fiducials are viewed by the cameras 7. The graticules are then brought into register with the printed fiducials on the subject substrate 9 and if these do not coincide with the stored location of the original fiducials a characteristic correction factor is calculated. Errors of this sort are typically introduced by the squeegee movement or other system characteristic factors. This correction factor is stored and used as an offset for subsequent print cycles. In subsequent cycles the substrate 9 is mounted on the table using the location system, e.g. pins 40, the graticules are moved into register with the substrate fiducial marks, the table 4 is moved to the print position and the screen fiducials aligned to the graticules, and a print is effected. Accuracy is monitored by checking the fiducials printed by the printing process after the table 4 has been withdrawn from the print position.

Since the cameras 7 are effectively integrally part of the print table 4, the accuracy of the "in" and "out" position of the table is irrelevant. Since the camera graticules are brought into register with the substrate fiducial and travel therewith, the need for accurate positioning of substrates on the table is removed; and since the screen is brought into register with the graticule just prior to printing the need for the mechanical accurate repetition of the screen position, required by prior systems, is removed.

This embodiment of the invention has repeatedly demonstrated alignments of 0.0025 cm or better without the need for a printing machine with a very high precision mechanism.

It will be appreciated by the appropriately skilled man, that the semi-automatic embodiment of the invention hereinbefore described, could be replaced by a fully automatic embodiment, wherein appropriate image recognition software could replace the role of the operator. Thus its function would be to locate the appropriate fiducials and bring the screen and the substrate into register by driving stepping motor 41, or other accurate positioning means.

I claim:

1. Apparatus for use in printing, comprising:

a print table mounted on a base frame of the apparatus;

support means secured to the print table;

vision means secured to the support means disposed such that the vision means views a major face of the print table;

means for securing a substrate to the print table;

means for mounting a screen; and means for effecting relative movement between the print table and screen mounting means, from a first position in which the vision means can view fiducial marks carried by the substrate to a second position in which the screen is positioned between the vision means and the substrate, in which the vision means can view fiducial marks carried by the screen whereby to facilitate the adjustment of the relative positions of the screen and the substrate so that the fiducial marks on the screen and the substrate are in register, thereby effecting registration of screen and substrate.

2. Apparatus according to claim 1 wherein the support means comprises members rigidly joined to form a support frame rigidly attached to a support assembly on which the vision means is mounted by means which firmly and stably secures the vision means but permits adjustment when required.

3. Apparatus as in claim 1 or 2 which further comprises image processing means, adapted to process image data from the vision means, and output processed image data to a display means.

4. Apparatus as in claim 3 wherein the processed image data produces an image as viewed by the vision means, with an additional superimposed variable position graticule.

5. Apparatus as in claim 4 further comprising a means for positioning the variable position graticule adapted to permit control by a human operator.

6. A method of registration of a substrate carrying fiducial marks and a screen using apparatus as in claim 5, wherein the graticule is used to electronically mark the location of the fiducial marks of the substrate, and the support frame and a screen are relatively moved so that the screen fiducial marks are brought into register with the graticule, thus bringing into register the substrate and the screen.

7. A method of bringing into register of a subject substrate with a screen as in claim 6 wherein after marking the location of the fiducial marks of the subject substrate, the location of the graticule is modified by a characteristic correction factor ascertained from a previous test print.

8. Apparatus for use in printing, comprising:

a print table mounted on a base frame of the apparatus;

support means secured to the print table;

vision means secured to the support means disposed such that the vision means views a major face of the print table;

means for securing a substrate to the print table;

means for mounting a screen;

means for effecting relative movement between the print table and screen mounting means from a first position in which the vision means can view fiducial marks carried by the substrate to a second position in which the screen is positioned between the vision means and the substrate, in which the vision means can view fiducial marks carried by the screen whereby to facilitate the adjustment of the relative positions of the screen and the substrate so that the fiducial marks on the screen and the substrate are in register; and image processing means, adapted to process image data from the vision means, and output processed image date; wherein the processed image data produces an image as viewed by the vision means, with an additional superimposed variable position graticule.

9. Apparatus as in claim 8, further comprising a means for positioning the variable position graticule which can be controlled by a human operator.

10. Apparatus as in claim 9 wherein the print table has a subject substrate mounted thereon.

* * * * *